US008922234B2

(12) United States Patent
Shiraishi et al.

(10) Patent No.: US 8,922,234 B2
(45) Date of Patent: Dec. 30, 2014

(54) PROBE CARD AND METHOD FOR MANUFACTURING PROBE CARD

(71) Applicant: Shinko Electric Industries Co., Ltd., Nagano-ken (JP)

(72) Inventors: Akinori Shiraishi, Nagano (JP); Hideaki Sakaguchi, Nagano (JP); Mitsutoshi Higashi, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 14/067,685

(22) Filed: Oct. 30, 2013

(65) Prior Publication Data

US 2014/0055157 A1    Feb. 27, 2014

Related U.S. Application Data

(62) Division of application No. 13/089,522, filed on Apr. 19, 2011, now abandoned.

(30) Foreign Application Priority Data

Apr. 21, 2010    (JP) ................................. 2010-098013

(51) Int. Cl.
G01R 31/00    (2006.01)
G01R 1/073    (2006.01)
H05K 3/40    (2006.01)

(52) U.S. Cl.
CPC ........ *G01R 1/07307* (2013.01); *G01R 1/07314* (2013.01); *H05K 3/4007* (2013.01); *G01R 1/0735* (2013.01); *G01R 1/07364* (2013.01); *H05K 2201/0314* (2013.01); *H05K 2201/0367* (2013.01); *H05K 2201/10378* (2013.01); *H05K 2203/1572* (2013.01)
USPC ............ 324/756.03; 324/755.07; 324/754.21; 324/755.05; 324/755.08; 439/169; 439/482; 439/219; 174/258; 174/251; 174/262; 361/783

(58) Field of Classification Search
CPC ........ G01R 1/067; G01R 31/00; G01R 31/02; G01R 31/26; G01R 1/073; G01R 1/07307; G01R 3/00; G01R 1/07378; G01R 31/2889
USPC ............... 324/756.03, 755.01, 437, 445, 467, 324/754.03; 439/169, 482, 219
See application file for complete search history.

(56) References Cited

U.S. PATENT DOCUMENTS 5,886,877 A    3/1999    Shingai et al.
5,926,029 A    7/1999    Ference et al.
(Continued)

FOREIGN PATENT DOCUMENTS

JP    H09-330995    12/1997
JP    2001-52779 A    2/2001
(Continued)

OTHER PUBLICATIONS

Office Action from corresponding Japanese patent application 2010-098013, dated Jul. 24, 2013, pp. 1-3.

*Primary Examiner* — Patrick Assouad
*Assistant Examiner* — Taqi Nasir
(74) *Attorney, Agent, or Firm* — Wolf, Greenfield & Sacks, P.C.

(57) ABSTRACT

A probe card for conducting an electrical test on a test subject includes a substrate body including a first surface, which faces toward the test subject, and a second surface, which is opposite to the first surface. A through electrode extends through the substrate body between the first surface and the second surface. A contact bump is formed in correspondence with the electrode pad and electrically connected to the through electrode. An elastic body is filled in an accommodating portion, which is formed in the substrate body extending from the first surface toward the second surface. The contact bump is formed on the elastic body.

4 Claims, 11 Drawing Sheets

(56) References Cited

U.S. PATENT DOCUMENTS

| | | | |
|---|---|---|---|
| 6,239,983 B1 | 5/2001 | Shingai et al. | |
| 6,350,957 B1 | 2/2002 | Shingai et al. | |
| 6,433,563 B1 | 8/2002 | Maruyama | |
| 7,825,674 B2* | 11/2010 | Shinde et al. | 324/756.03 |
| 8,159,248 B2* | 4/2012 | Cordes et al. | 324/754.18 |
| 8,248,090 B2* | 8/2012 | Ni et al. | 324/750.29 |
| 8,410,806 B2* | 4/2013 | Smith | 324/755.01 |
| 8,451,017 B2* | 5/2013 | Gleason et al. | 324/754.2 |
| 2005/0140382 A1 | 6/2005 | Wilson et al. | |
| 2005/0277323 A1* | 12/2005 | Eldridge et al. | 439/482 |
| 2006/0170438 A1* | 8/2006 | Park et al. | 324/754 |
| 2007/0178727 A1* | 8/2007 | Igarashi et al. | 439/91 |
| 2009/0134895 A1 | 5/2009 | Miller | |
| 2009/0144971 A1 | 6/2009 | Takekoshi | |
| 2010/0085069 A1* | 4/2010 | Smith et al. | 324/754 |
| 2011/0025357 A1* | 2/2011 | Lee et al. | 324/754.03 |
| 2011/0121846 A1 | 5/2011 | Mochizuki | |

FOREIGN PATENT DOCUMENTS

| | | |
|---|---|---|
| JP | 2001-165956 | 6/2001 |
| JP | 2010-002302 | 1/2010 |
| WO | 2007/007736 | 1/2007 |

* cited by examiner

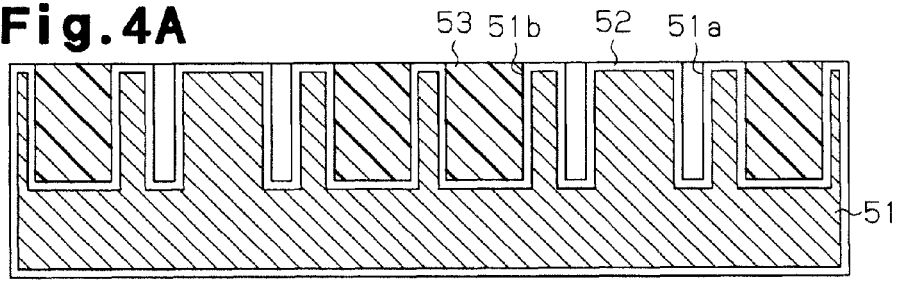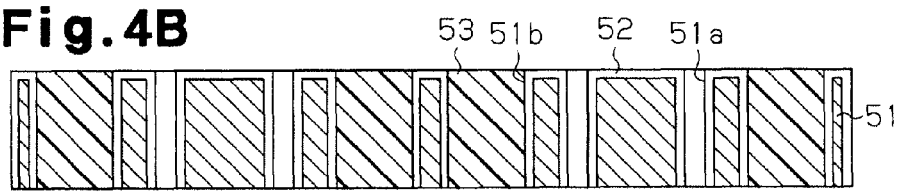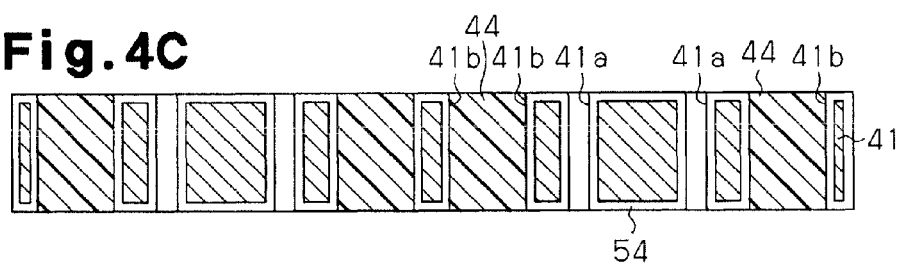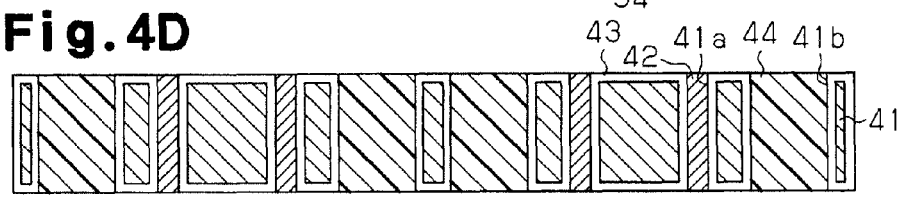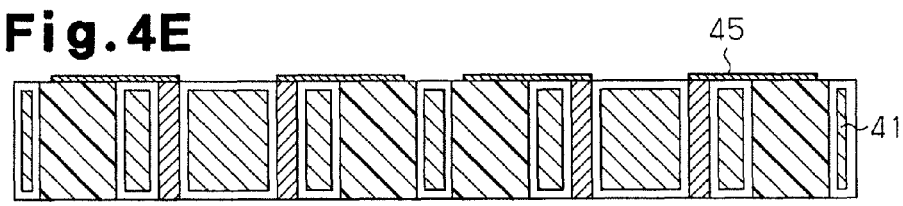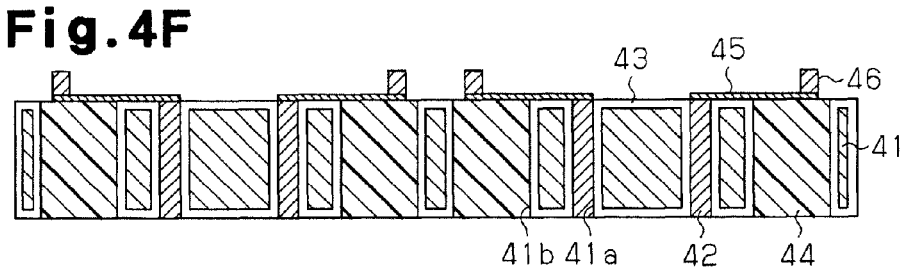

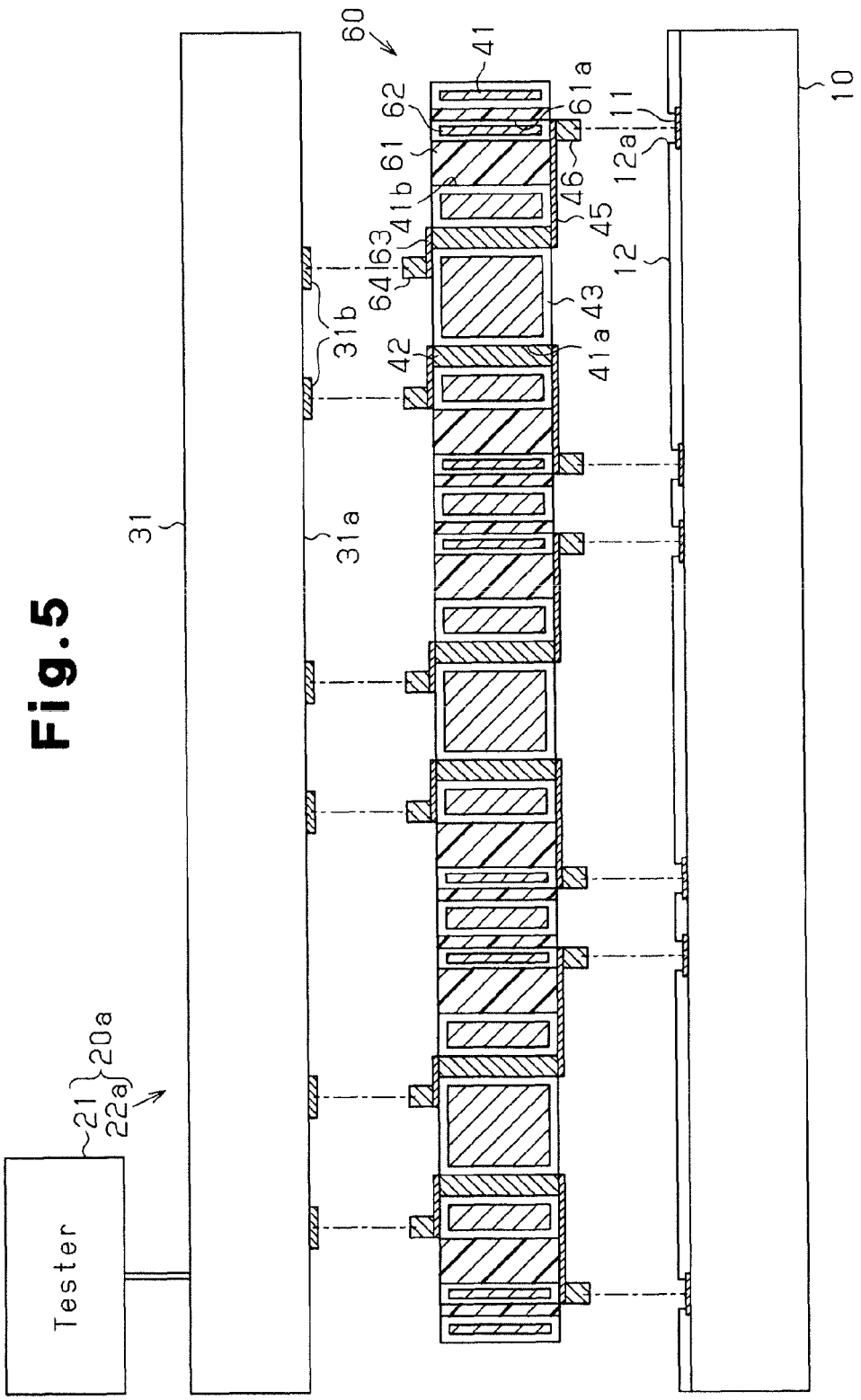

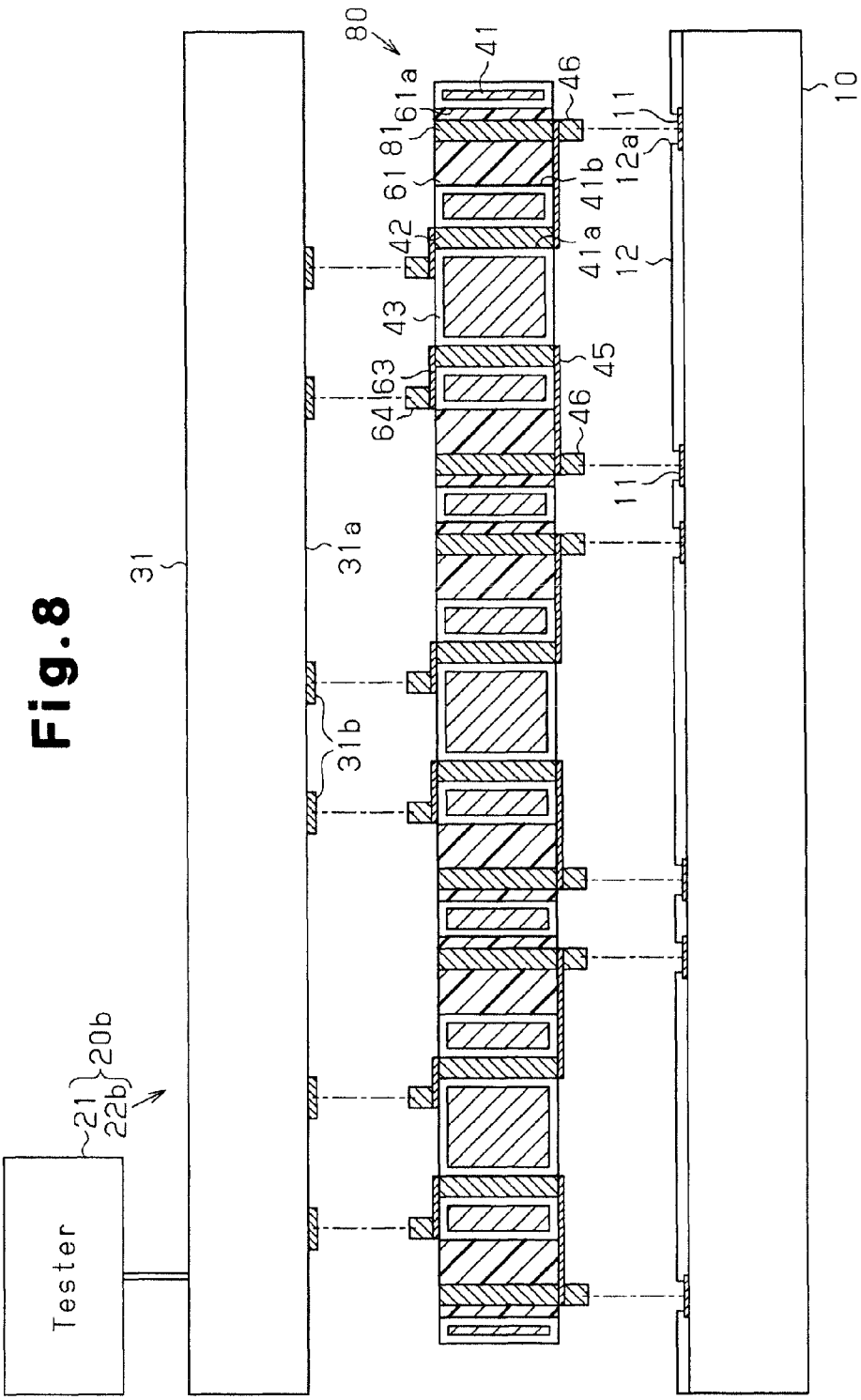

PROBE CARD AND METHOD FOR MANUFACTURING PROBE CARD

RELATED APPLICATIONS

This application is a divisional application under U.S.C. §120 of U.S. application Ser. No. 13/089,522, filed Apr. 19, 2011, which application is based upon and claims the benefit of priority under 25 U.S.C. §119 from prior Japanese Patent Application No. 2010-098013, filed on Apr. 21, 2010, the entire contents of which are incorporated herein by reference.

BACKGROUND OF THE INVENTION

The present invention relates to a probe card and a method for manufacturing a probe card.

In the prior art, a process for manufacturing a semiconductor device includes a test process for testing the electrical characteristics of a semiconductor chip. A semiconductor testing device used in this process includes a probe needle electrically connected to an electrode pad formed on a semiconductor chip in a wafer. The semiconductor testing device, for example, provides an electric signal to a circuit formed on the semiconductor chip through the probe needle and receives a signal output from the circuit through the probe needle to test the operation of the circuit based on the received signal and determine whether the semiconductor chip functions properly.

Due to the trend in higher element integration and increase in the number of processing signals of a semiconductor chip, the number of electrode pads (pins) formed on a semiconductor chip has been increasing (greater number of pins). Further, the pitch of the electrode pads on a semiconductor chip has been decreasing. Accordingly, it is difficult to accurately contact each electrode pad with the probe needle. Various proposals have been made on how to form a plurality of connection terminals on a substrate of a testing device to enable simultaneous connection with a plurality of electrode pads.

Japanese Laid-Open Patent Publication No. 2001-52779 describes a contact probe including contact projections formed integrally with a probe body. The probe body and the contact projections are formed by resin molding an anisotropic conductive resin.

A passivation film is formed on a surface of the semiconductor chip. An electrode pad is exposed from an opening formed in the passivation film. However, the contact projections described in Japanese Laid-Open Patent Publication No. 2001-52779 are molded from resin to be pyramidal or a semispherical. Thus, the contact projections may not be able to contact the electrode pads depending on the ratio (aspect ratio) of the size of the electrode pads (dimension of opening) exposed from the passivation film and the thickness of the passivation film.

SUMMARY OF THE INVENTION

Other aspects and advantages of the present invention will become apparent from the following description, taken in conjunction with the accompanying drawings, illustrating by way of example the principles of the invention.

One aspect of the present invention is a probe card for electrically connecting to an electrode pad formed on a test subject to conduct an electrical test on the test subject. The probe card includes a substrate body having a first surface, which is located to face toward the test subject, and a second surface, which is opposite to the first surface. A through electrode extends through the substrate body between the first surface and the second surface. A contact bump is formed in correspondence with the electrode pad and electrically connected to the through electrode. An elastic body is filled in an accommodating portion. The accommodation portion is formed in the substrate body extending from the first surface toward the second surface. The contact bump is formed on the elastic body.

Another aspect of the present invention is a method for manufacturing a probe card for electrically connecting to an electrode pad formed on a test subject to conduct an electrical test on the test subject. The method includes forming a first deep hole and a second deep hole in a substrate, filling the first deep hole with an elastic body, forming a substrate body by reducing thickness of the substrate so that the first and second deep holes respectively become first and second through holes, forming a through electrode in the second through hole, and forming a contact bump corresponding to the electrode pad on the elastic body.

A further aspect of the present invention is a method for manufacturing a probe card for electrically connecting to an electrode pad formed on a test subject to conduct an electrical test on the test subject. The method includes forming a first deep hole in a substrate, filling the first deep hole with an elastic body, forming a substrate body by reducing thickness of the substrate so that the first deep hole becomes a first through hole, forming a second through hole in the elastic body, forming a through electrode in the second through hole, and forming a contact bump connected to the through electrode.

BRIEF DESCRIPTION OF THE DRAWINGS

The invention, together with objects and advantages thereof, may best be understood by reference to the following description of the presently preferred embodiments together with the accompanying drawings in which:

FIGS. 4A to 4F are schematic views showing the manufacturing process of the probe card of FIG. 1;

FIG. 5 is a cross-sectional view of a probe card according to a second embodiment;

FIG. 8 is a cross-sectional view of a probe card according to a third embodiment;

DETAILED DESCRIPTION OF THE INVENTION

Hereinafter, each embodiment will be described with reference to the accompanied drawings. The accompanied drawings schematically show structures and do not illustrate the actual size.

First Embodiment

A first embodiment will now be described with reference to FIGS. 1 to 4.

Figure 1:
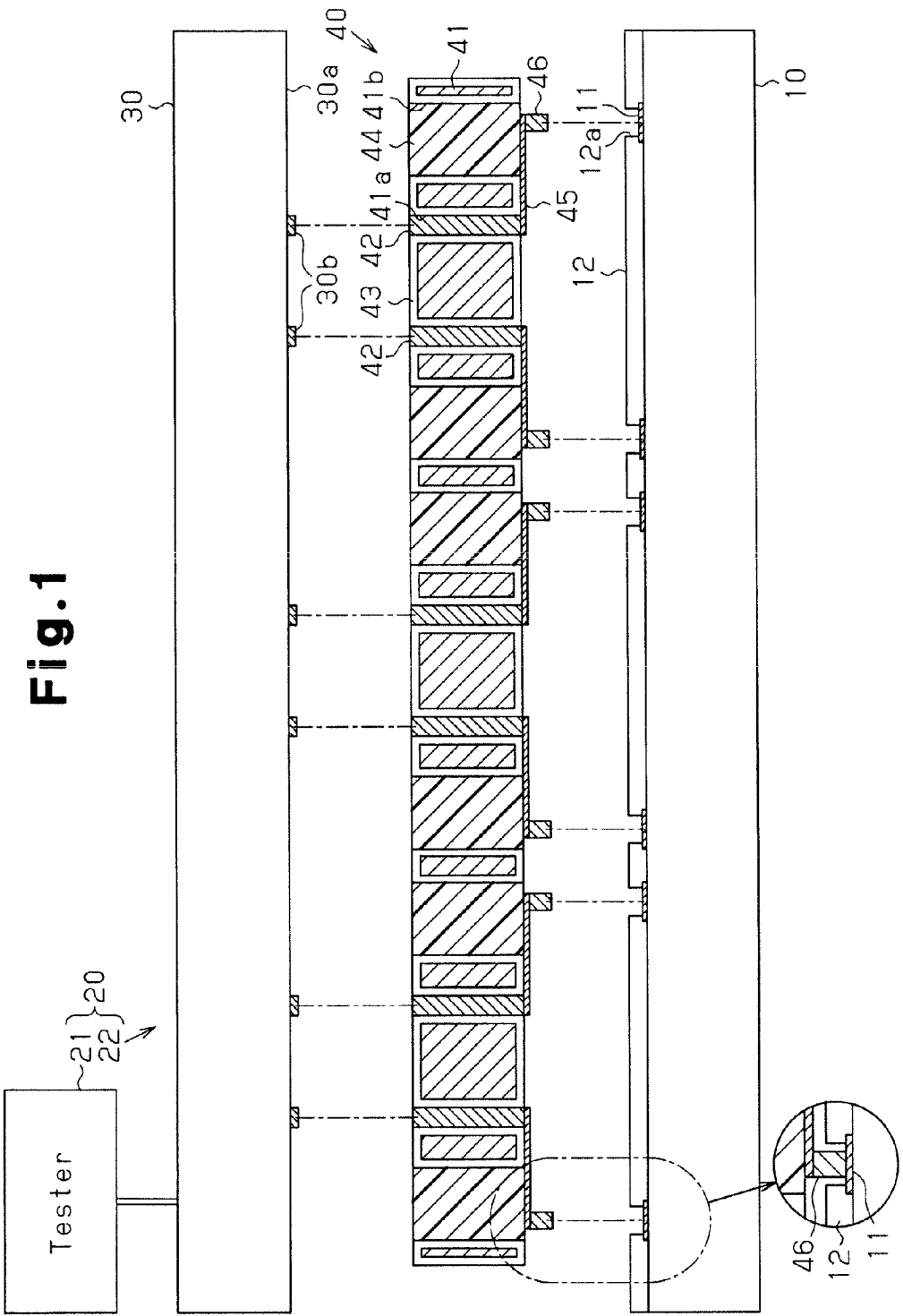
FIG. 1 is a schematic diagram showing a substrate testing device according to a first embodiment.

As shown in FIG. 1, a semiconductor testing device 20 for testing a test subject 10 includes a tester 21 and a probe device 22, which is connected to the tester 21.

The test subject 10 is a semiconductor wafer including a plurality of semiconductor chips. That is, the probe device 22 tests the semiconductor chips in a wafer before the semiconductor chips are cut into individual chips. The test subject 10 includes a plurality of electrode pads 11 connected to elements of the semiconductor chips. A passivation film 12 is formed on the test subject 10. Each electrode pad 11 is exposed from the passivation film 12 through an opening 12a formed in the passivation film 12.

The probe device 22 includes a wiring substrate 30 and a probe card 40. Connection bumps 30b are formed on a lower surface 30a of the wiring substrate 30. The connection bumps 30b are formed from gold tin solder. The wiring substrate 30 includes wires (not shown) connecting the connection bumps 30b to the tester 21. In FIG. 1, the wiring substrate 30 and the probe card 40 are shown spaced apart from each other. However, the probe card 40 is connected to the connection bumps 30b of the wiring substrate 30.

The probe card 40 includes a substrate body 41. The substrate body 41 is formed from the same material (i.e., silicon) as the substrate of the test subject 10. Ceramic, glass, resin (e.g., insulating resin), metal (e.g., Cu), or the like may be used as the material of the substrate body 41.

Figure 2:
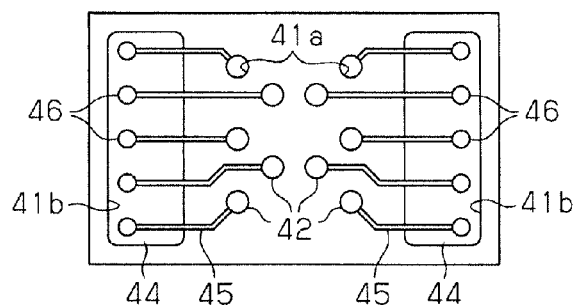
FIG. 2 is a bottom view showing a probe card of the first embodiment shown in FIG. 1.

The probe card 40 includes through electrodes 42 that extend through the substrate body 41 between an upper surface and lower surface of the substrate body 41. Each through electrode 42 is fixed in a through hole 41a that extends through the substrate body 41 between an upper surface and lower surface of the substrate body 41. FIG. 2 shows a portion of the probe card 40 that corresponds to one semiconductor chip. A plurality of (ten in FIG. 2) through electrodes 42 are arranged spaced apart from each other. The through electrodes 42 are formed from copper (Cu). Referring to FIG. 1, each through electrode 42 is insulated from the substrate body 41 by an insulating film 43 (e.g., silicon oxide film). FIG. 1 shows the cross-section of the probe card 40. The hatching of the insulating film 43 is omitted to facilitate the understanding of members such as the substrate body 41 and the through electrodes 42. The through electrodes 42 are formed at positions corresponding to the connection bumps 30b of the wiring substrate 30. Each through electrode 42 includes an upper end connected to the connection bump 30b of the wiring substrate 30.

The probe card 40 also includes elastic bodies 44 that extend through the substrate body 41 between an upper surface and lower surface of the substrate body 41. Each elastic body 44 is fixed in a through hole 41b that extends through the substrate body 41 between an upper surface and lower surface of the substrate body 41. In this manner, the through hole 41b serves to accommodating the elastic body 44. The elastic body 44 is formed from an elastic resin such as silicone resin. In the first embodiment, referring to FIG. 2, two elastic bodies 44 are arranged in correspondence with each semiconductor chip, and each elastic body 44 extends in a predetermined direction. The direction in which the elastic body 44 extends corresponds to the direction in which the electrode pads 11 are laid out on the test subject 10.

Wires 45 are formed on the lower surface of the substrate body 41. The wires 45 are made of copper, nickel (Ni), nickel alloy, or the like. As shown in FIG. 2, each wire 45 includes a first end, connected to the lower surface of the corresponding through electrode 42, and a second end, connected to the lower surface of the elastic body 44. The second ends of the wires 45 are laid out in the direction the elastic body 44 extends.

As shown in FIG. 1, a contact bump 46 is formed on a lower surface of the second end of each wire 45. Thus, as shown in FIG. 2, a plurality of contact bumps 46 are formed on each elastic body 44. In this manner, a single through hole 41b and a single elastic body 44, which is arranged in the through hole 41b, are formed in correspondence with a plurality of contact bumps 46.

The contact bumps 46 are made of nickel, copper, nickel alloy, or the like. The contact bumps 46 are formed at positions corresponding to the electrode pad 11 of the test subject 10. Each contact bump 46 is cylindrical and extends downward from the lower surface of the second end of the corresponding wire 45.

The contact bumps 46 are shaped in conformance with the exposed portions of the electrode pads 11 and the thickness of the passivation film 12. For instance, when the passivation film 12 on the electrode pad 11 has a thickness of 10 μm, the contact bumps 46 each have a diameter of 15 μm and a vertical length of 20 μm.

As shown in FIG. 2, each elastic body 44 is rectangular and extends in the direction in which the contact bumps 46 are laid out. The corners are rounded in the elastic body 44. Each wire 45 is formed to extend from one long side (first long side) to the other long side (second long side) of the elastic body 44, namely, the direction in which the short sides of the through hole 41b and elastic body 44 extend. The contact bumps 46 are arranged near the long side of the elastic body 44 that are not intersected by the wires 45, namely, the first long side of the elastic body 44. This increases the lengths of each wire 45 on the elastic body 44 so that the wire 45 easily absorbs the expansion and contraction of the elastic body 44 caused by movement of the contact bumps 46. The expansion and contraction of the elastic body 44 decreases the stress applied to the wires 45 and prevent the wires 45 from breaking. When the stress does not have to decreased, the shape of the elastic body 44 and the layout of the contact bumps 46 may be changed.

The probe device 22 is held parallel to the test subject 10, which is fixed onto an inspection table (not shown). The probe device 22 is positioned so that the contact bumps 46 of the probe card 40 face toward the electrode pads 11 of the test subject 10, and the contact bumps 46 are brought into contact with the electrode pads 11.

As shown in an enlarged manner at the lower left section of FIG. 1, each contact bump 46 is formed in correspondence with the shape of the test subject 10, specifically, the shape of the opening in the passivation film 12 that exposes the corresponding electrode pad 11 and the thickness of the passivation film 12. Thus, when the thickness of the passivation film 12 is increased, the vertical length of the contact bump 46, that is, the aspect ratio of the bump 46, may be varied accordingly. This ensures that the contact bump 46 comes into contact with the electrode pad 11. Further, the shape of the contact bump 46 may be set in correspondence with the shape of the passivation film 12. Thus, the shape of the test subject 10 may easily be changed.

When the contact bumps 46 are brought into contact with the electrode pad 11, the corresponding elastic body 44 is located immediately above the contact bumps 46. Due to the elasticity of the elastic body 44, the contact bumps 46 are movable in the vertical direction. Accordingly, even when the contact bumps 46 have varied lengths, the elastic body 44 absorbs such length variation as the contact bumps 46 enter the through holes 41b of the elastic body 44. Thus, each contact bump 46 properly contacts the corresponding electrode pad 11.

Even when the probe device 22 and the test subject 10 are tilted relative to each other, in the same manner, the elastic body 44 allows for each contact bump 46 to be properly brought into contact with the electrode pad 11. That is, even if the probe device 22 is supported in a tilted state, certain electrode pads 11 enter the through holes 41b and contact the corresponding contact bumps 46 before the other electrode pads 11 contact their corresponding bumps 46 in accordance with the tilting. Then, the other contact bumps 46 come into contact with their corresponding electrode pads 11.

When the probe device 22 is lowered and the test subject 10 and probe device 22 become close to each other, the elastic force of the elastic body 44 presses the contact bumps 46 toward the electrode pads 11. This electrically connects the contact bumps 46 and the electrode pads 11.

The elastic body 44 extends through the substrate body 41. That is, the elastic body 44 is exposed from the upper surface of the substrate body 41. Accordingly, when the contact bumps 46 enter the through holes 41b, the elastic body 44 expands upward from the through hole 41b, that is, the upper surface of the substrate body 41. This expansion decreases the pressure (pressing force) applied between the contact bumps 46 and the electrode pads 11.

In this manner, the contact bumps 46 of the probe card 40 are brought into contact with and electrically connected to the electrode pads 11 of a plurality of semiconductor chips formed in the test subject 10. This allows for the testing of a plurality of semiconductor chips to be conducted in parallel. Thus, the testing time of the test subject 10 is reduced compared to when testing semiconductor chips in series.

Further, the test subject 10 is formed from the same material (silicon) as the substrate body 41. This decreases the difference in coefficient of thermal expansion between the probe card 40 and the test subject 10. Thus, the contact bumps 46 accurately contact the electrode pads 11 on the semiconductor chips. When the temperature of the test subject 10 is changed during testing, the substrate body 41 expands and contracts in accordance with the temperature. This limits deviation in the relative positions of the contact bumps 46 and electrode pads 11.

The manufacturing process of the probe card 40 will now be described. Here, the substrate body 41 is made of silicon.

Figure 3A:
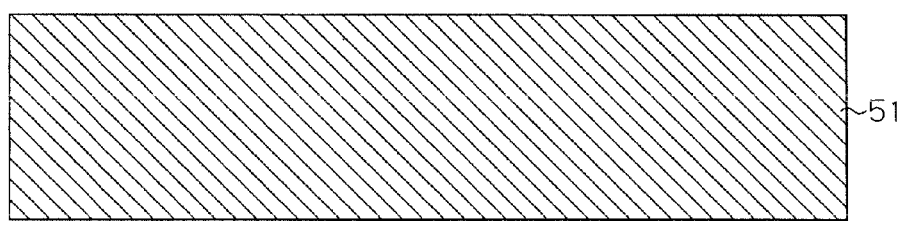
FIGS. 3A to 3C are schematic views showing a manufacturing process of the probe card of FIG. 1.

First, referring to FIG. 3A, a substrate 51, which is a silicon wafer, is prepared. The thickness of the substrate 51 is, for example, 725 µm to 775 µm.

Figure 3B:
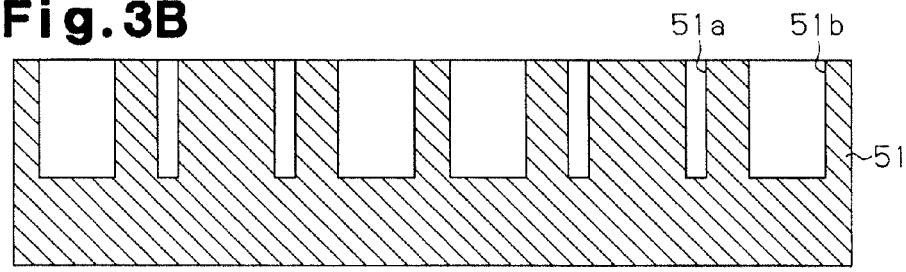

Referring to FIG. 3B, a mask (not shown) including openings is used to etch the substrate 51 by performing high aspect ratio, such as deep reactive ion etching (DRIE), through the openings of the mask. This forms deep holes 51a, which correspond to the through electrodes 42 shown in FIG. 1, and deep holes 51b, which correspond to the elastic bodies 44 in the substrate 51.

Figure 3C:
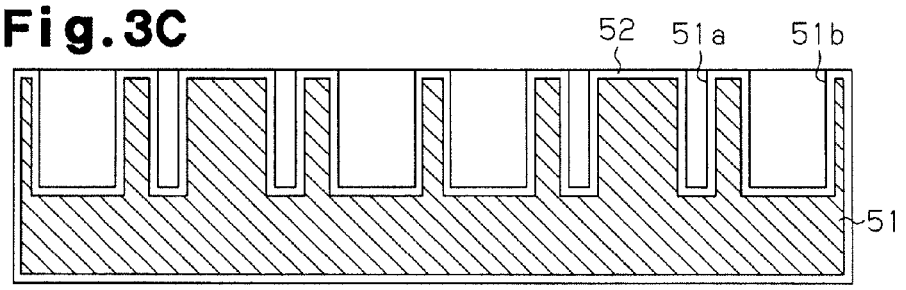

Then, referring to FIG. 3C, the substrate 51 is thermally oxidized. This forms an insulating film 52, which is a silicon oxide film, on the entire surface of the substrate 51 and the wall surfaces of the deep holes 51a and 51b.

Referring to FIG. 4A, an elastic resin 53 is filled into the deep holes 51b by performing through vacuum printing or the like.

Referring to FIG. 4B, back grinding is performed to grind the lower surface of the substrate 51 and reduce the thickness of the substrate 51 so that the deep holes 51a and 51b become through holes. This forms the through holes 41a and 41b in the substrate 51. The thinned substrate 51 has a thickness of, for example, 200 µm. Thus, the deep holes 51a and 51b formed by the process shown in FIG. 3B are deeper than the thickness of the thinned substrate 51.

Referring to FIG. 4C, low temperature CVD is performed to form an insulating film 54, which is a silicon oxide film, on the lower surface (ground surface) of the substrate 41. The insulating film 43 shown in FIG. 1 is formed by the insulating film 54 and the insulating film 52, which is formed in the process of FIG. 3C. As shown in FIG. 1, this forms the substrate body 41 that includes the through holes 41a and 41b. This also forms the elastic bodies 44 filled in the through holes 41b.

Referring to FIG. 4D, the through electrodes 42 are formed in the through holes 41a, for example, by performing plating or by filling a conductive paste.

Referring to FIG. 4E, the wires 45 are formed using a mask (not shown) including openings, for example, by performing physical vapor deposition (PVD) or plating, through the openings of the mask.

Then, referring to FIG. 4F, the contact bumps 46 are formed on the second ends of the wires 45, for example, by performing plating.

The first embodiment has the advantages described below.

(1) The probe card 40 includes the elastic body 44 that extends through the substrate body 41 between the upper surface and lower surface of the substrate body 41. The wires 45 are formed on the lower surface of the substrate body 41. The second ends of the wires 45 are arranged on the lower surface of the elastic body 44. Each contact bump 46, which is electrically connected to the corresponding electrode pad 11, is formed on the lower surface of the second end of each wire 45 at a position corresponding to the electrode pad 11 of the test subject 10. The contact bump 46 is formed to be cylindrical in accordance with the shape of the test subject 10, namely, the opening shape and thickness of the passivation film 12 from which the electrode pads 11 are exposed. Thus, when the thickness of the passivation film 12 increases, the length (height) in the vertical direction of the contact bumps 46, or the aspect ratio of the contact bumps 46, can be varied accordingly. This allows for the contact bumps 46 to properly contact the electrode pads 11. Further, the shape of the contact bumps 46 may be set in correspondence with the shape of the passivation film 12. Thus, the contact bumps 46 are applicable to changes in the shape of the test subject 10.

(2) The elastic body 44 is located immediately above the contact bumps 46. Since the elastic body 44 is elastic, the contact bumps 46 are movable in the vertical direction. Thus, even when contact bumps 46 vary in length, the elastic body 44 absorbs such length variation of the contact bumps 46 as the contact bumps 46 enter the through holes 41b of the elastic body 44. Thus, the contact bumps 46 properly contact the electrode pads 11.

(3) Even when the probe device 22 and the test subject 10 are tilted relative to each other, the elastic body 44 allows for each contact bump 46 to contact the corresponding electrode pad 11. That is, even if the probe device 22 is supported in a tilted state, certain electrode pads 11 contact the corresponding contact bumps 46 and enter the through holes 41b before the other electrode pads 11 contact their corresponding bumps 46 in accordance with the tilting. Then, the other contact bumps 46 contact their corresponding electrode pads 11. Thus, the other contact bumps 46 also appropriately come into proper contact with the corresponding electrode pads 11.

Further, for example, when the probe device 22 is lowered so that the test subject 10 and the probe device 22 become relatively close to each other, the elastic force of the elastic body 44 presses the contact bumps 46 toward the electrode pad 11. This further ensures proper electrical connection between the contact bumps 46 and the electrode pads 11.

Second Embodiment

A second embodiment will be described with reference to FIGS. 5 to 7. To avoid redundancy, like or same reference numerals are given to those components that are the same as the corresponding components of the first embodiment. Such components will not be described in detail.

As shown in FIG. 5, a semiconductor testing device 20a includes the tester 21 and a probe device 22a. The probe device 22a includes a wiring substrate 31 and a probe card 60. Connection pads 31b (electrode pads) are formed on a lower surface 31a of the wiring substrate 31. The connection pads 31b are made of copper, nickel, nickel alloy, or the like. Wires (not shown) connecting the connection pads 31b and the tester 21b are also formed on the wiring substrate 31.

The probe card 60 includes through electrodes 42 that extend through the substrate body 41 between the upper surface and the lower surface of the substrate body 41. The through electrodes 42 are fixed in the through holes 41a that extend through the substrate body 41 between the upper surface and the lower surface of the substrate body 41.

The probe card 40 includes through electrodes 42 that extend through the substrate body 41 between the upper surface and the lower surface of the substrate body 41. The through electrodes 42 are fixed in the through holes 41a that extend through the substrate body 41 between the upper surface and the lower surface of the substrate body 41.

The probe card 60 also includes elastic bodies 61 that extend through substrate body 41 between the upper surface and the lower surface of the substrate body 41. The elastic bodies 61 are fixed in the through holes 41b, which extend through the substrate body 41 between the upper surface and the lower surface of the substrate body 41. That is, the through holes 41b serve as accommodating portions for the elastic body 61 in the second embodiment. The elastic bodies 61 are made of an elastic resin such as silicone resin.

The probe card 60 includes a plurality of support bodies 62 that extend through each elastic body 61 between the upper surface and the lower surface of the elastic body 61. Each support body 62 is fixed in a through hole 61a that extends through the elastic body 61 between the upper surface and the lower surface of the elastic body 61. The support bodies 62 are formed from the same material (silicon) as the substrate body 41. The surface of each support body 62 is covered by an insulating film (silicon oxide film).

In the same manner as the first embodiment, wires 45 are formed on the lower surface of the substrate body 41. Further, wires 63 are formed on the upper surface of the substrate body 41. Each wire 63 is made of copper, nickel, nickel alloy, or the like. Further, each wire 63 includes a first end, which is connected to the upper end of the through electrode 42, and a second end. A connection bump 64, which is connected to the corresponding connection pad 31b of the wiring substrate 31, is formed on the upper surface of the second end of each wire 63. The connection bump 64 is formed from gold tin solder.

Each wire 45 formed on the lower surface of the substrate body 41 includes a first end, which is connected to the lower end of the corresponding through electrode 42, and a second end, which is connected to the lower end of the corresponding support body 62. A contact bump 46 is formed on the lower surface of the second end of each wire 45. Thus, the contact bump 46 moves integrally with the support body 62.

As described above, the support bodies 62 are formed extending through the corresponding elastic body 61. Accordingly, the elastic body 61 restricts the moving direction of the support bodies 62. That is, the support bodies 62 move in the vertical direction relative to the substrate body 41. The contact bump 46 connected to the corresponding support body 62 via the wire 45 moves together with the support body 62 in the vertical direction relative to the substrate body 41. In other words, the support body 62 stably moves the contact bump 46 in the vertical direction.

The integral movement of the contact bump 46 and the support body 62 projects the upper end of the support body 62 out of the upper surface of the substrate body 41. Thus, the shape of the connection bump 64 is set so that the support body 62, when projecting out of the upper surface of the substrate body 41, does not contact the wiring substrate 31. For instance, the height (length in the vertical direction) of the connection bump 64 is set to be greater than or equal to the distance the contact bump 46 is movable, namely, the length of the contact bump 46.

The manufacturing process of the probe card 60 will now be described. In the same manner as the first embodiment, the substrate body 41 is made of silicon.

Figure 6A:
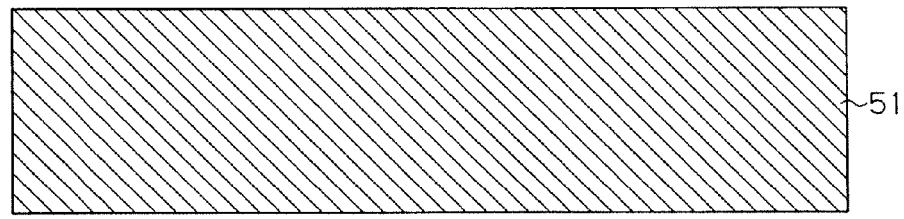
FIGS. 6A to 6D are schematic views showing a manufacturing process of the probe card of FIG. 5.

First, referring to FIG. 6A, the substrate 51, which is a silicon wafer, is prepared.

Figure 6B:
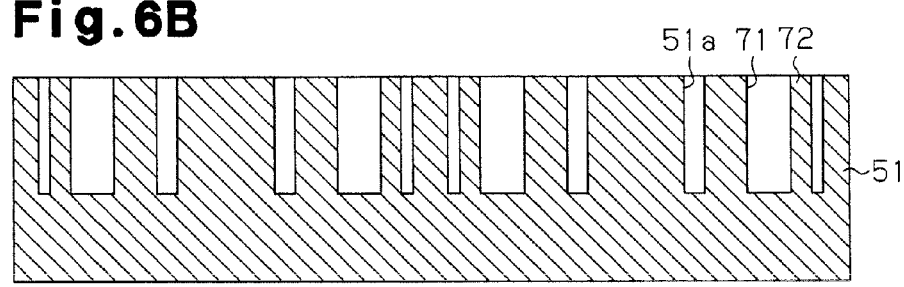

Then, referring to FIG. 6B, a mask (not shown) including openings is used to etch the substrate 51 by performing DRIE through the openings of the mask. This forms the deep holes 51a, which correspond to the through electrodes 42 shown in FIG. 1, and deep holes 71, which correspond to the elastic bodies 61, in the substrate 51. In this state, a cylindrical portion 72 is formed in each deep hole 71. The cylindrical portion 72 extends upward from the bottom of the deep hole 71 to form the support body 62. Instead of a cylindrical portion 72, a pillar such as a polygonal pillar may be used.

Figure 6C:
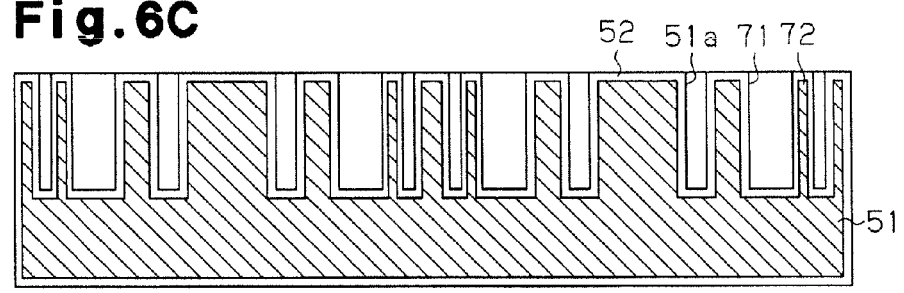

Referring to FIG. 6C, the insulating film 52, which is a silicon oxide film, is formed on the entire surface of the substrate 51, the walls surfaces of the deep holes 51a and 71, and the side surfaces of the cylindrical portions 72 by thermally oxidizing the substrate 51.

Figure 6D:
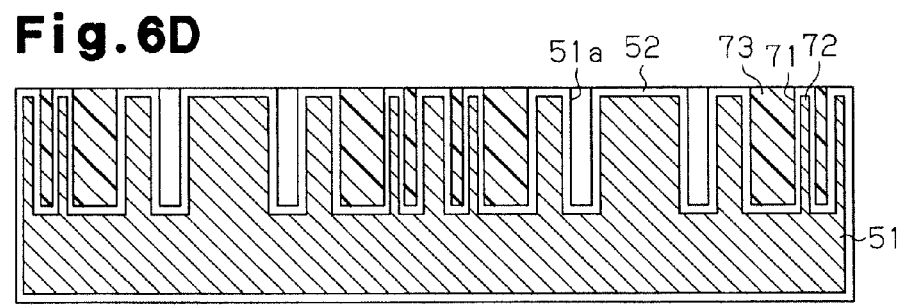

Referring to FIG. 6D, elastic resin 73 is filled into the deep holes 71 by performing vacuum printing or the like.

Figure 7A:
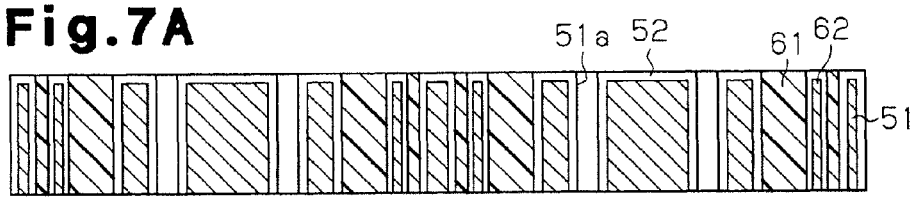
FIGS. 7A to 7E are schematic views showing the manufacturing process of the probe card of FIG. 5.

Referring to FIG. 7A, back grinding is performed to grind the lower surface of the substrate 51 and reduce the thickness of the substrate 51 so that the deep holes 51a and 71, which are shown in FIG. 6D, become through holes. This forms the through holes 41a and 41b in the substrate 51. This separates the cylindrical portions 72 from the substrate body 51. Further, the elastic resin 73 filled in each deep hole 71 forms the elastic body 61 that extends through the substrate 51.

Figure 7B:
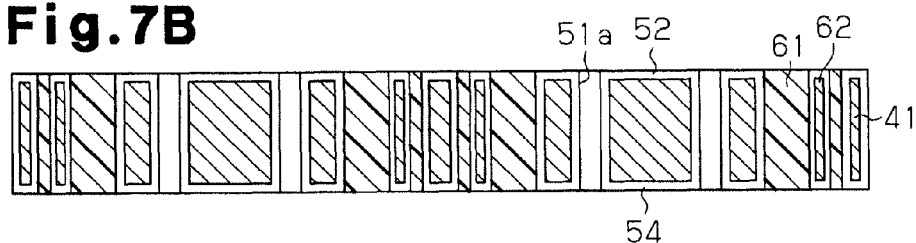

Referring to FIG. 7B, the insulating film 54, which is made of silicon oxide, is formed on the lower surface of the substrate 51 by performing low temperature CVD. This forms the substrate body 41 shown in FIG. 5. In this case, each support body 62 is formed by the corresponding cylindrical portion 72 and the insulating films 52 and 54.

Figure 7C:
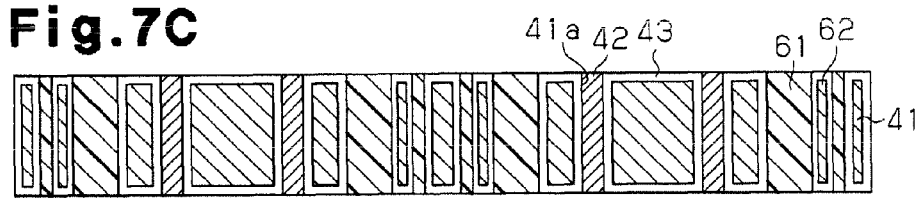

Referring to FIG. 7C, the through holes 41a are plated or filled with conductive paste to form the through electrodes 42.

Figure 7D:
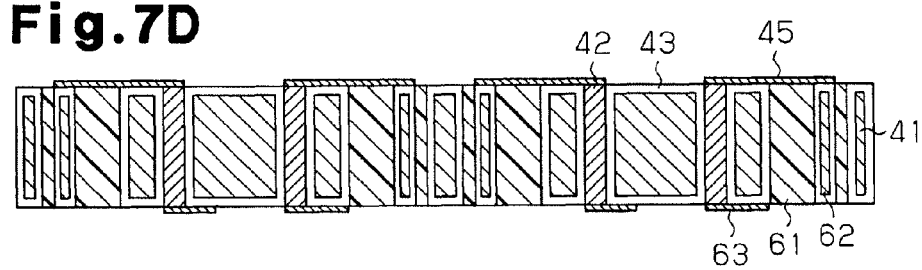

Referring to FIG. 7D, the wires 45 and 63 are formed using a mask (not shown) including openings, for example, by performing physical vapor deposition (PVD) or plating through the openings of the mask.

Figure 7E:
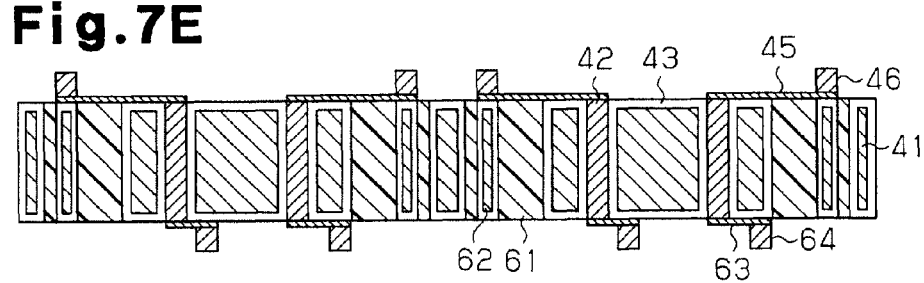

Referring to FIG. 7E, the connection bumps 64 and the contact bumps 46 are formed by performing plating or the like.

The second embodiment has the advantages described below in addition to the advantages of the first embodiment.

(4) The probe card 60 includes the support bodies 62 that extend through each elastic body 61 between the upper surface and the lower surface of the elastic body 61. Each wire 45 formed on the lower surface of the substrate body 41 includes a first end, which is connected to the lower end of the corresponding through electrode 42, and the second end, which is connected to the lower end of the corresponding support body 62. A contact bump 46 is formed on the lower surface of the second end of each wire 45. The contact bump 46 and the support body 62 move integrally. Thus, the support body 62 moves in the vertical direction relative to the substrate body 41. Accordingly, the contact bump 46, which is connected to the support body 62 via the wire 45, moves together with the support body 62 in the vertical direction relative to the substrate body 41. In this manner, the support body 62 stabilizes the vertical movement of the contact bump 46 in the vertical direction.

(5) The height (length in the vertical direction) of each connection bump 64, which connects the probe card 60 and the wiring substrate 31, is set to be greater than or equal to the distance the contact bump 46 moves, namely, the length of the contact bump 46. Accordingly, the connection bumps 64 allows for vertical movement of the contact bumps 46 and the support bodies 62 while preventing the support bodies 62, which are projecting out of the upper surface of the substrate body 41, from coming into contact with the wiring substrate 31.

Third Embodiment

A third embodiment will now be described with reference to FIGS. 8 to 10.

To avoid redundancy, like or same reference numerals are given to those components that are the same as the corresponding components of the first and second embodiments. Such components will not be described in detail.

As shown in FIG. 8, a semiconductor testing device 20b includes the tester 21 and a probe device 22b. The probe device 22b includes the wiring substrate 31 and a probe card 80. In the same manner as the probe card 60 of the second embodiment, the probe card 80 includes support bodies 81, which are fixed in the through holes 61a that extend through each elastic body 61 between the upper surface and the lower surface of the elastic body 61. The support bodies 81 of the third embodiment are formed from a conductive material (e.g., copper).

The manufacturing process of the probe card 80 will now be described. In the same manner as the first and second embodiments, the substrate body 41 is made of silicon.

Figure 9A:
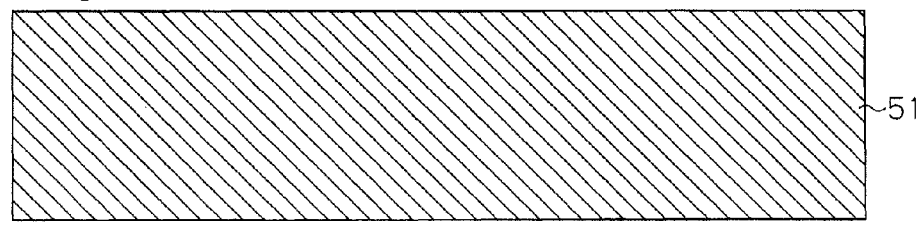
FIGS. 9A to 9E are schematic views showing a manufacturing process of the probe card of FIG. 8.

First, referring to FIG. 9A, the substrate 51, which is a silicon wafer, is prepared.

Figure 9B:
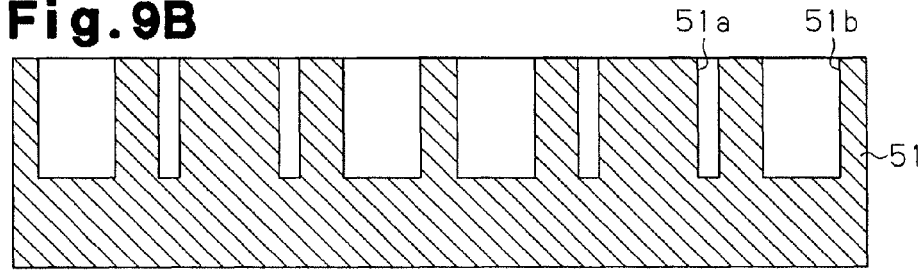

Referring to FIG. 9B, a mask (not shown) including openings is used to etch the substrate 51 by performing DRIE through the openings of the mask. This forms the deep holes 51a, which correspond to the through electrodes 42 shown in FIG. 1, and the deep holes 51b, which corresponding to the elastic bodies 61 in the substrate 51.

Figure 9C:
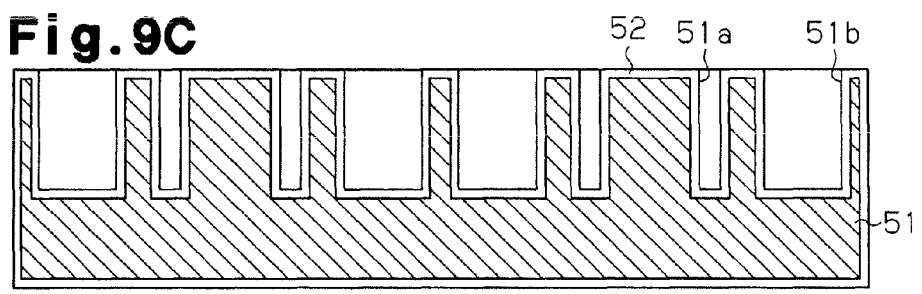

Referring to FIG. 9C, the insulating film 52, which is made of silicon oxide, is formed on the entire surface of the substrate 51 and the wall surfaces of the deep holes 51a and 51b by thermally oxidizing the substrate 51.

Figure 9D:
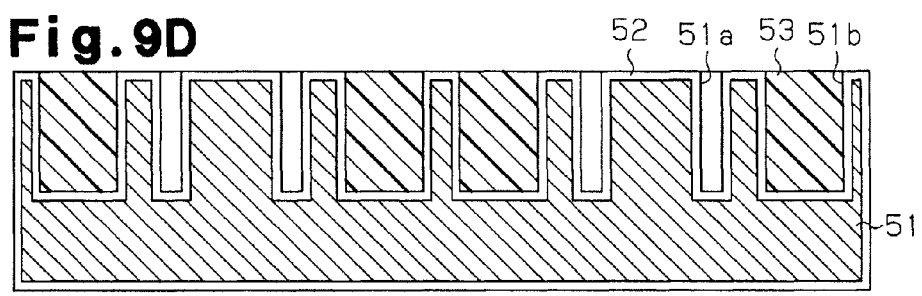

Referring to FIG. 9D, the deep holes 51b are filled with the elastic resin 53 by performing vacuum printing or the like.

Figure 9E:
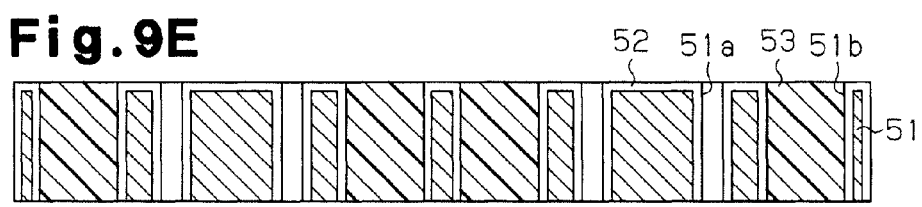

Referring to FIG. 9E, back grinding is performed to grind the lower surface of the substrate 51 and reduce the thickness of the substrate 51 so that the deep holes 51a and 51b become through holes. This forms the through holes 41a and 41b.

Figure 10A:
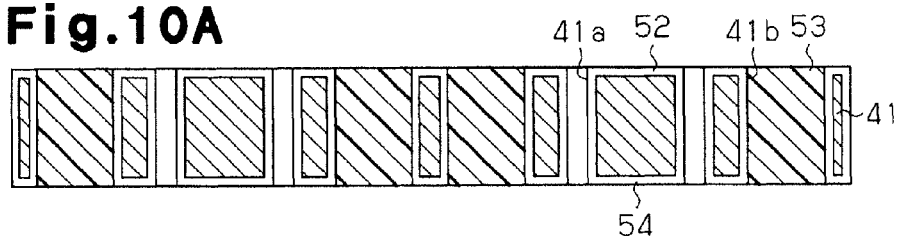
FIGS. 10A to 10E are schematic views showing the manufacturing process of the probe card of FIG. 8.

Referring to FIG. 10A, the insulating film 54, which is made of silicon oxide, is formed on the lower surface of the substrate 51 by performing low temperature CVD.

Figure 10B:
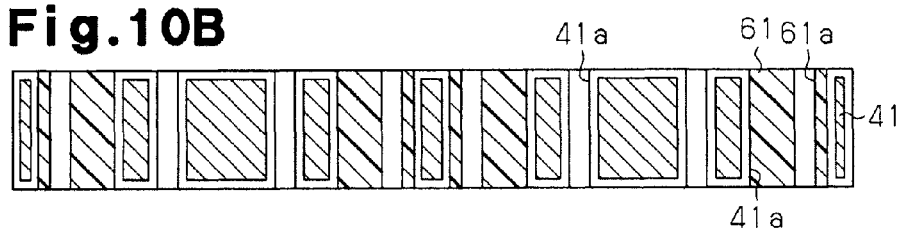
Figure 10C:
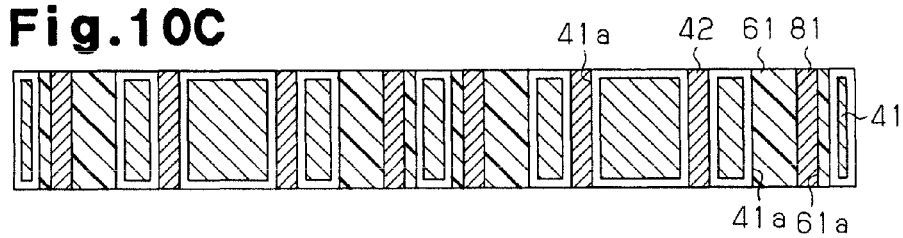

Referring to FIG. 10B, the through hole 61a is formed in the elastic body 61 by performing laser processing, for example.

Referring to 10C, the through holes 41a in the substrate body 41 are plated or filled with conductive paste to form the through electrodes 42 in the through holes 41a. In the same manner, the through holes 61a in the elastic bodies 61 are plated or filled with conductive paste to form the support bodies 81 in the through holes 61a.

Figure 10D:
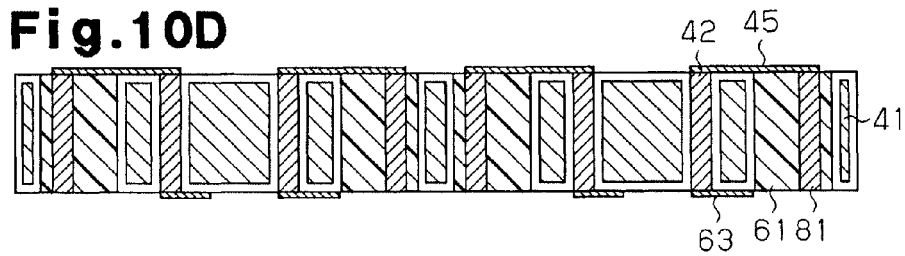

Referring to FIG. 10D, the wires 45 and 63 are formed using a mask (not shown) including openings by performing physical vapor deposition (PVD), plating, or the like through the openings of the mask.

Figure 10E:
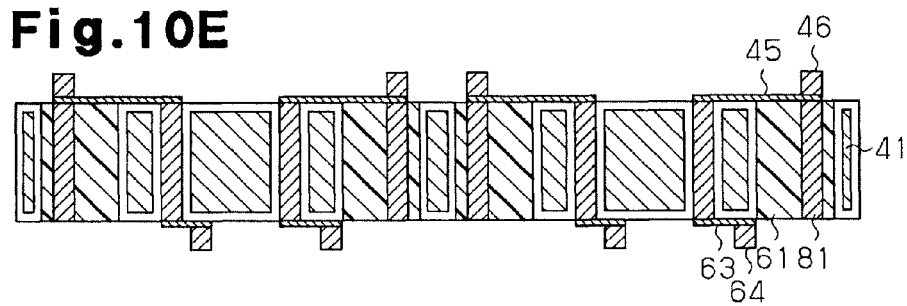

Then, referring to FIG. 10E, the connection bumps 64 and the contact bumps 46 are formed through plating or the like.

The third embodiment has the advantage described below in addition to the advantages of the first and second embodiments.

(6) The probe card 80 includes the support bodies 81, which are fixed in the through holes 61a that extend through each elastic body 61 between the upper surface and the lower surface of the elastic body 61. The support bodies 81 of the third embodiment are made from a conductive material (e.g., copper). In this manner, the support body 81 may be formed from various materials and does not have to be formed from the same material as the substrate body 41.

It should be apparent to those skilled in the art that the present invention may be embodied in many other specific forms without departing from the spirit or scope of the invention. Particularly, it should be understood that the present invention may be embodied in the following forms.

Figure 11A:
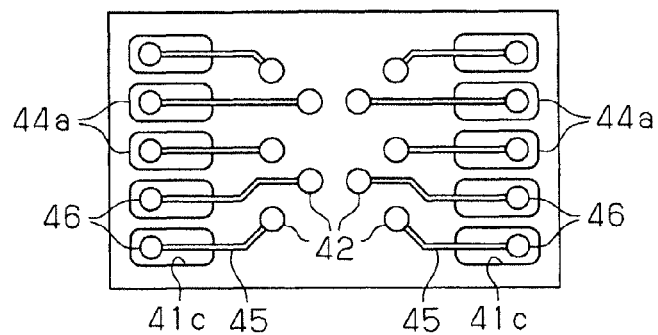
FIGS. 11A and 11B are bottom views showing another probe card.

The shape of the elastic body 44 may be changed. For instance, as shown in FIG. 11A, through holes 41c and elastic bodies 44a may respectively be formed for the contact bumps 46. That is, a through hole 41c and an elastic body 44a may be formed for each contact bump 46. As shown in FIG. 11A, when viewed from above, each of the through holes 41c and elastic bodies 44a have a substantially rectangular shape. The wire 45 connected to the contact bump 46 extends parallel to the long side direction of the corresponding elastic body 44a from one short side (first short side) to the other short side (second short side) of the elastic body 44a. In other words, the contact bump 46 is arranged near the short side over which the wire 45 does not extend, that is, the first short side. In the same manner as the first embodiment (see FIG. 2), the wire 45 easily absorbs the expansion and contraction of the corresponding elastic body 44a. Thus, the stress applied to the wire 45 by the expansion and contraction of the elastic body 44a is reduced, and breakage of the wire 45 is prevented. Further, although the elastic bodies 44a must be formed separately, each contact bump 46 is not affected by the contact bumps 46 that are arranged near by.

Figure 11B:
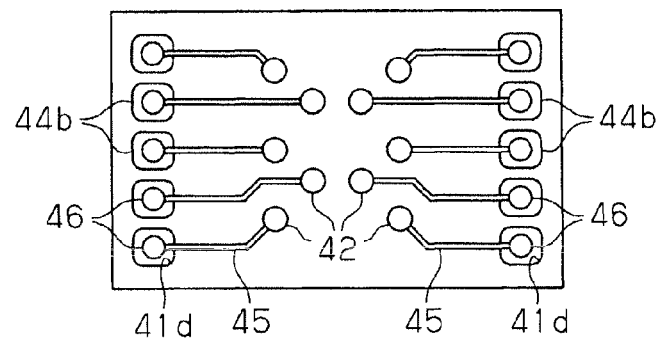

As shown in FIG. 11B, through holes 41d and elastic bodies 44b may respectively be for the contact bumps 46. In the case of FIG. 11B, when viewed from above, each of the through holes 41d and elastic bodies 44b have a substantially square or circular shape. Each contact bump 46 is arranged on the center of the corresponding elastic body 44b.

Figure 12A:
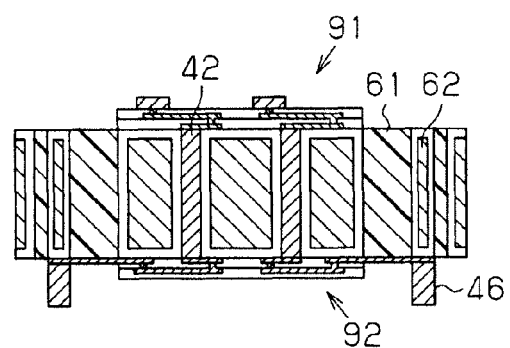
FIGS. 12A and 12B are cross-sectional views showing another probe card.

As shown in FIG. 12A, wiring multi-layers 91 and 92 may be formed on at least one of the upper and lower surfaces of the substrate body 41. The wiring multi-layers 91 and 92 are formed by superimposing a wiring layer and an insulating layer by performing, for example, a buildup process. The formation of the wiring multi-layers 91 and 92 allows for the through electrodes 42 to be formed at any position.

Figure 12B:
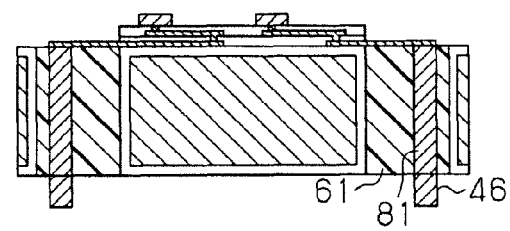

Referring to FIG. 12B, the support body 81 may be formed by a conductive material (metal). In this case, the support body 81 may be used as the through electrode. In other words, the through electrode (support body 81) is formed extending through the elastic body 61 between the upper surface and the lower surface of the elastic body 61, and the contact bump 46 is formed at an end of the through electrode (support body 81). That is, the contact bump 46 may be directly connected to the conductive support body 81. This structure allows for elimination of the process for wiring the lower surface of the substrate body 41 may be omitted. The wiring multi-layer 91 at the upper surface of the substrate body 41 may be used for connection as shown in FIG. 12B. Alternatively, wiring in a single layer may be used for connection in the same manner as the embodiments described above.

Figure 13A:
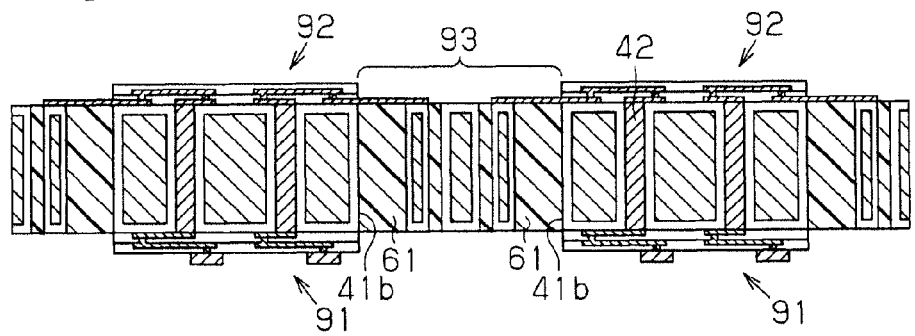
FIGS. 13A and 13B are schematic views showing a manufacturing process of another probe card.
Figure 13B:
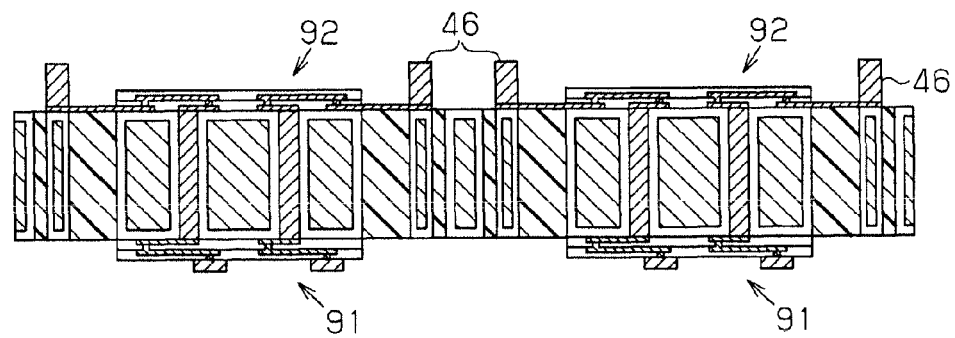

For instance, when using the wiring multi-layers 91 and 92 shown in FIG. 12A, after each through electrode 42 is formed, the build-up process is performed to superimpose the wiring layer and insulating layer and form the wiring multi-layer 91 and 92 as shown in FIG. 13A. This forms non-formation portions 93, which are free from wiring multi-layers at regions in the upper side and lower side of each through hole 41b filled with the elastic body 61. Referring to FIG. 13B, this structure facilitates the formation of the contact bumps 46 without movement of the contact bumps 46 in the vertical direction being interfered.

Figure 14:
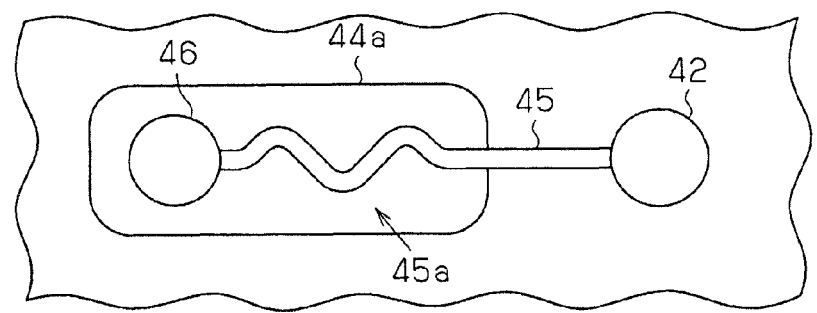
FIG. 14 is a partial bottom view of another probe card.

As shown in FIG. 14, the wire 45 may include a bent portion 45a that absorbs the expansion and contraction of the elastic body 44a.

Instead of the silicon oxide film ($SiO_2$), a silicon nitride film (SiN) or the like may be formed as the insulating film. Further, different types of insulating films, such as a silicon oxide film and a silicon nitride film, may be superimposed to form the insulating film.

The manufacturing process in the above described embodiments may be changed. For instance, the process of forming the through electrode 42 shown in FIG. 4D may be performed before the process of forming the insulating film 54 (FIG. 4C) or the process of reducing the thickness of the substrate 51 (FIG. 4B).

In the first embodiment, the elastic body 44 may be formed so as not to extend through the substrate body 41. That is, a recess (accommodating portion) formed in the substrate body 41 extending upward from the contact bumps 46 may be used in lieu of the through holes 41b. For instance, the depth of the deep holes 51b (see FIG. 3B) that receive the elastic bodies 44 may be less than the reduced thickness of the substrate body 41 in the manufacturing process. In this case, each elastic body 44 is also arranged immediately above the corresponding contact bump 46, and the elastic body 44 allows for movement of the contact bump 46 in the vertical direction.

The above described embodiments are applied to the probe cards 40, 60, and 80, which are used to test semiconductor chips in wafers, but may also be applied to probe cards used to test the independent semiconductor chips.

In addition to a semiconductor wafer, the test subject may include a plurality of terminals, such as a semiconductor package.

A gold layer may be applied to the surface of each contact bump 46. The gold layer is formed by performing plating. The gold layer reduces the contact resistance of the contact bump 46 and the electrode pad 11.

The shape of the contact bumps 46 may be changed. In accordance with the shape of the test subject 10, the contact bumps 46 may be formed to be semispherical or spherical shape when the aspect ratio of the opening for exposing the electrode pad and the thickness of the passivation film is low.

In the second and third embodiments, the connection bumps 64 may be arranged on the wiring substrate 31 in the same manner as the first embodiment.

The present examples and embodiments are to be considered as illustrative and not restrictive, and the invention is not to be limited to the details given herein, but may be modified within the scope and equivalence of the appended claims.

What is claimed is:

1. A probe card for electrically connecting to an electrode pad formed on a test subject to conduct an electrical test on the test subject, the probe card comprising:
   a substrate body including a first surface located to face toward the test subject, and a second surface opposite to the first surface;
   a through electrode formed in a first through hole extending through the substrate body between the first surface and the second surface;
   an elastic body formed in a second through hole extending through the substrate body between the first surface and the second surface, wherein the elastic body includes a first surface exposed from the first surface of the substrate body and a second surface exposed from the second surface of the substrate body;
   a support body formed in a third through hole extending through the elastic body between the first and second surfaces of the elastic body;
   a wire formed on the first surface of the substrate body, wherein the wire includes a first end connected to an end of the through electrode exposed from the first surface of the substrate body and a second end connected to an end of the support body exposed from the first surface of the elastic body, and the wire extends along the first surface of the elastic body between the first end and the second end; and
   a contact bump formed in correspondence with the electrode pad, connected to the end of the support body via the second end of the wire, and electrically connected to the through electrode by the wire.

2. The probe card according to claim 1, wherein the probe card electrically connects the electrode pad of the test subject to a wiring substrate with the through electrode, and the probe card further comprises:
   a connection bump arranged on the second surface of the substrate body, wherein the connection bump is electrically connected to a second electrode pad formed on the wiring substrate, and the connection bump has a height that is set in correspondence with movement of the contact bump.

3. The probe card according to claim 1, further comprising:
   an insulating film formed on the first and second surfaces of the substrate body and between the through electrode and the substrate body to separate the through electrode from the substrate body, wherein
   the insulating film is further formed on a first edge surface and a second edge surface of the support body and on a side surface of the support body to separate the support body from the elastic body, and
   the contact bump is connected to the end of the support body via the insulating film on the first edge surface of the support body.

4. The probe card according to claim 1, wherein the support body is formed from a conductive material.

* * * * *